RADIO RECEIVER

Filed Dec. 1, 1945

Inventor:
Robert E. Samuelson,
By Clinton, Wiles, Schroeder, Merriam & Hofgren, Attys.

Nov. 3, 1953 R. E. SAMUELSON 2,658,138

RADIO RECEIVER

Filed Dec. 1, 1945 2 Sheets-Sheet 2

Inventor:
Robert E. Samuelson,
By Clinton, Wiles, Schroeder, Merriam & Hofgren, Attys.

Patented Nov. 3, 1953

2,658,138

UNITED STATES PATENT OFFICE 2,658,138

RADIO RECEIVER

Robert E. Samuelson, Chicago, Ill., assignor to The Hallicrafters Co., a corporation of Illinois Application December 1, 1945, Serial No. 632,269

2 Claims. (Cl. 250—20)

Figures 1, 2:
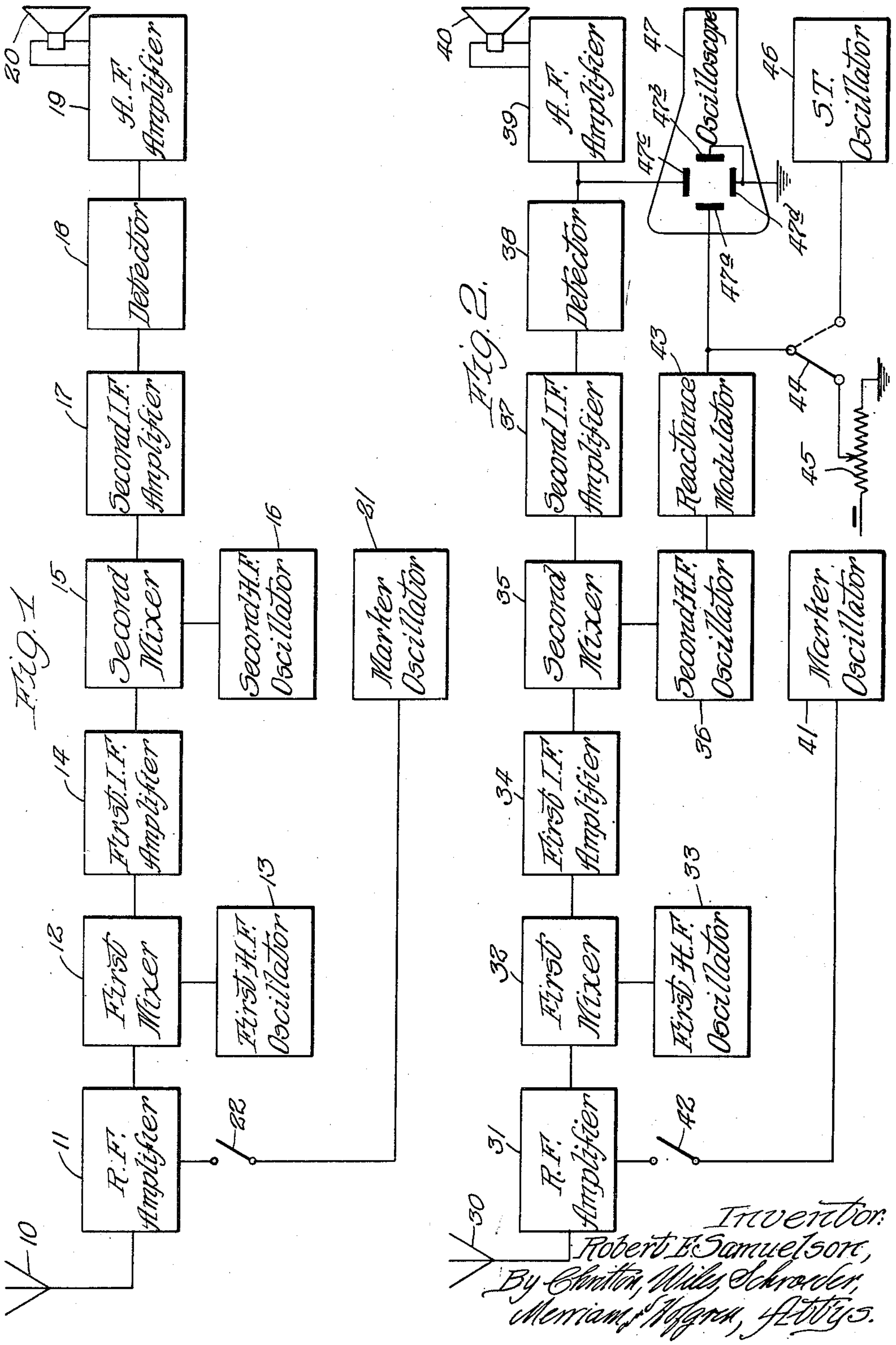

This invention relates to a radio receiver, and more particularly to a receiver of the superheterodyne type with an improved band spread arrangement.

A radio receiver, particularly one designed to operate in a higher frequency range, is usually provided with a band spread arrangement in conjunction with the main tuning system to enable the set to be tuned with what might be termed precision movement over a certain limited range when the main tuning control has been set to approximately the signal desired. The arrangements now in general use, however, use a small variable reactance in conjunction with a main reactance in the tank circuit, this usually taking the form of a small variable condenser in shunt with the principal capacitive reactance, whether this is fixed or variable. This type of band spread arrangement has several disadvantages, as for example that accurate calibration cannot be effected, that the frequency range covered by the band spread control varies with variation of the band on which the set is operating and the setting of the main tuning control, and in that the addition of extra tuning components with their wiring introduces undesired couplings and otherwise reduces the efficiency of the electrical circuits.

I have devised and am here disclosing and claiming a band spread arrangement which obviates these and other difficulties of present band spread systems and which provides a receiver of considerable flexibility of usefulness, in that it is particularly adapted to be used for panoramic tuning systems, for example, systems wherein the band pass width of the intermediate frequency amplifier is readily variable by the user of the receiver, and the like. My system comprises radio frequency and first intermediate frequency portions having wide band pass characteristics and adapted to pass a frequency band containing a plurality of signal channels, together with heterodyning means for heterodyning signals on any selected band to this first intermediate frequency; and a second intermediate frequency amplifying portion with relatively narrow band pass characteristics adapted to pass only frequencies of a single signal channel, together with an oscillator tunable over only a limited range comprising a small fraction of its mean operating frequency, the tuning range of this second oscillator being preferably the same as the pass band of the first portions of the receiver.

The tuned circuits of the second oscillator comprise the band spread arrangement, and the tuning control of this circuit may be accurately calibrated, as the oscillator can be made quite stable, and always operates over the same frequency range. Moreover, this band spread arrangement operates over the same constant frequency increment regardless of the band on which the set may be operating. The result is a very satisfactory and effective band spread arrangement providing high frequency stability and capable of accurate calibration and selection of signals.

Figure 3:
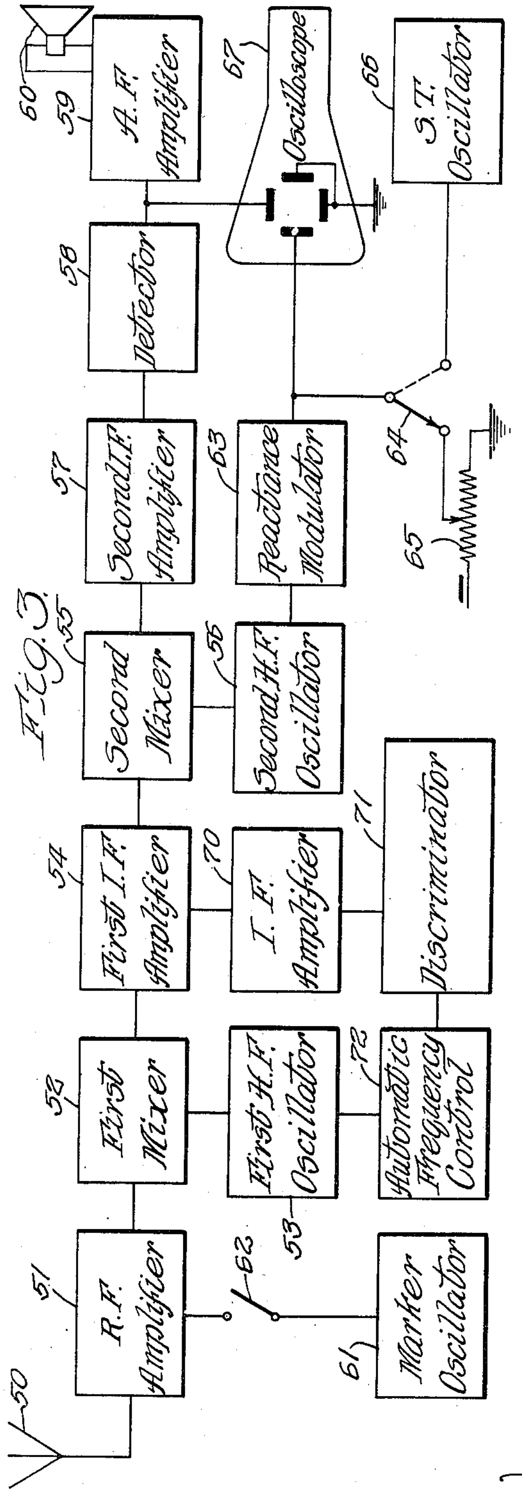
Figure 4:
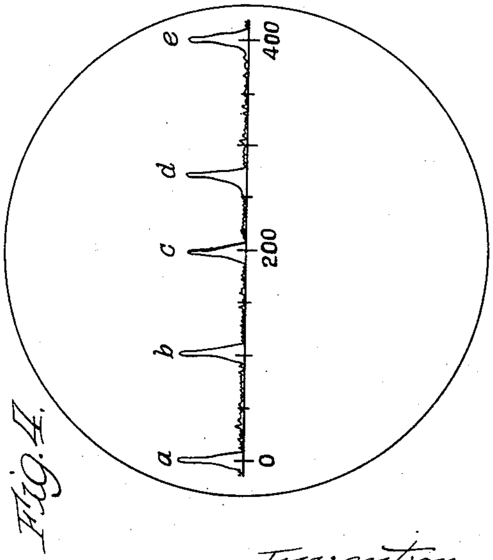
Figure 5:
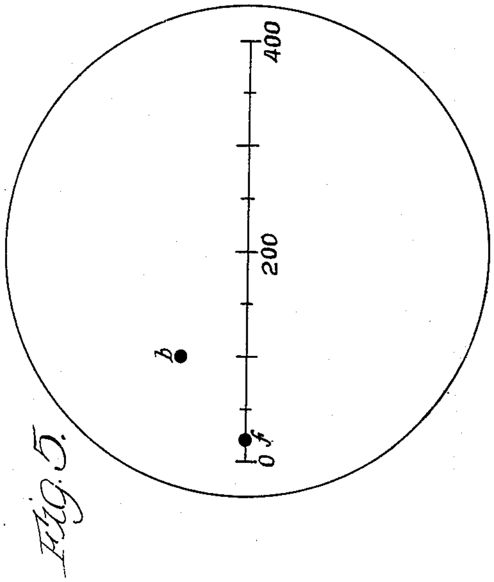

Other features and advantages of this invention will be apparent from the following specification and drawings, in which:

Figure 1 is a block diagram illustrating a superheterodyne receiving system comprising one embodiment of my invention; Figure 2 is a block diagram of another radio receiving system also embodying my inventions; Figure 3 is a block diagram of another form of super-heterodyning receiving system embodying my inventions; Figure 4 is a front elevational view of an oscilloscope screen under one set of conditions where my inventions are being used in connection with panoramic tuning systems; and Figure 5 is a front elevational view of the oscilloscope screen of Figure 4 under a different set of conditions.

In the particular embodiment of my invention illustrated in Figure 1, signals picked up by an antenna 10 are passed through a radio frequency amplifier 11 which may comprise one or more stages of amplification. In accordance with conventional practice this radio frequency amplifying portion of the receiver would be provided with interchangeable coils or other means for making selection between various reactance elements in order that the set might operate on a plurality of bands; but it would differ from the conventional radio frequency amplifier in that it should be designed to pass substantially uniformly a frequency band of substantial width comprising a number of signal channels, as for example a band having a width of 400 kilocycles. In order to avoid image frequencies and other undesired signals the radio frequency amplifier should be designed considerably to attenuate other frequencies outside of this desired pass band.

The output of the radio frequency amplifier 11 is supplied to a first mixer or first detector 12, this mixer also being supplied with the wave output of a first high frequency oscillator 13, the result being to heterodyne all the signals in the pass band to a first intermediate frequency. The tuning control of the first high frequency oscillator 13 comprises the main tuning control of the receiver, enabling it to be tuned to a desired section or frequency range in the band selected by changing coils, moving a band selecting switch, or the like. The tuned circuit of the first high frequency oscillator 13 is preferably ganged with the tuned circuit or circuits of the radio frequency amplifier 11.

The desired heterodyne output of the first mixer 12 is delivered to a first intermediate frequency amplifier 14 which would preferably comprise several stages in cascade. The tuned circuits of this first intermediate frequency amplifier are arranged so that they pass, substantially without attenuation, a band of the same width as that which the radio frequency amplifier is designed to pass, while sharply attenuating signals lying outside of this band. The output of this amplifier 14 is delivered to a second mixer 15 which is also supplied with the wave output of a second high frequency oscillator 16. This second oscillator should be of considerably lower frequency than the first oscillator, and is designed to be tunable over a frequency range equal to the pass range of the first intermediate frequency amplifier and only a small fraction of the mean frequency of this second oscillator.

The desired output of the second mixer is delivered to a second intermediate frequency amplifier 17 of conventional type preferably comprising several stages. This intermediate frequency amplifier 17 would have relatively narrow band pass characteristics, being intended to pass only a single signal channel. The output of this amplifier 17 is delivered to a conventional detector 18, sometimes called the second detector, and the audio output of this detector is then amplified in an audio frequency amplifier 19 and translated into sound waves by any conventional electro-mechanical translating device, as the speaker 20.

In order to improve the accuracy of calibration I provide a marker oscillator 21 adapted to be connected to the radio frequency amplifier 11 when desired by operation of the switch 22. This marker oscillator should have its fundamental frequency very accurately predetermined, as by crystal control, and should be rich in harmonics, so that harmonics of the order of as much as a 40th or 50th harmonic may be used for calibration purposes. The output arrangement of this marker oscillator is preferably provided with tuned circuits for suppressing either the odd or even harmonics or for permitting all harmonics to go through, together with a three-position switch or other similar switch for selecting any one of these three types of output.

In order more clearly to illustrate the operation and advantages of my receiving system, I will describe its operation on a particular frequency portion of a particular band, with representative frequencies throughout the system being specified, in the reception of one particular type of signal with a particular channel spacing, as voice signals with 10 kilocycles channel spacings. It will be understood, however, that the principles here being disclosed are applicable to any type of receiver with any type of signal and channel spacing and on any desired band or bands, although these inventions attain their greatest advantage in connection with high frequency bands in excess of one megacycle.

If it should be desired to receive a signal lying between 7,000 kc. and 7,400 kc. the proper band selection would, of course, first be made in connection with the tuned circuits of the radio frequency amplifier 11 and the first high frequency oscillator 13, the frequencies of this oscillator bearing a predetermined relation to the frequency band for which the first intermediate frequency amplifier 14 is designed, of course. For the purposes of this example we may assume that the first intermediate frequency amplifier is designed to pass the band lying between 1,600 and 2,000 kilocycles. If the circuits of the radio frequency amplifier are arranged to pass frequencies lying between 7,000 and 7,400 kilocycles and the first oscillator 13 is tuned to a frequency of 5,400 as a part of the preliminary band and range selection tuning procedure, it will be seen that signals picked up by the antenna 10 in the range between 7,000 and 7,400 kilocycles will appear as intermediate frequency signals lying between 1,600 and 2,000 kilocycles and pass through the first intermediate frequency amplifier 14 to appear in its output in amplitudes which are functions of the original signal amplitudes reaching the antenna.

If the second intermediate frequency amplifier 17 is designed to pass a 10 kilocycle band with its center at 455 kilocycles, as is quite conventional, the second high frequency oscillator under the conditions assumed may have a frequency variable between 2,055 and 2,455 kilocycles, for example, this frequency range over which the oscillator is tunable, in this particular example, being only about ⅕ of its mean operating frequency. Because of this, and because this second oscillator does not need any band switching arrangement associated with it, it can be so designed as to have considerable stability and an accurate frequency relationship to the calibrations of its control dial, which may for example be calibrated linearly from zero to 400 kilocycles, the zero position corresponding to an actual second oscillator output frequency of 2,055 kilocycles under the conditions assumed. With this second oscillator tuning control set at its lower position it will thus be apparent that a 1,600 kilocycle signal in the output of the first intermediate frequency amplifier 14 (corresponding to an antenna signal of 7,000 kilocycles) will be heterodyned to 455 kilocycles and passed on through the detector 18 and audio frequency amplifier 19 to the speaker 20, all other signals being eliminated by the operation of the relatively sharply tuned circuits of the second intermediate frequency amplifier 17. On the other hand, with the control dial of the second oscillator 16 set to the other limit of its range of operation (the 400 kilocycle graduation), a 2,000 kilocycle signal in the output of the first intermediate frequency amplifier 14 (corresponding to an antenna signal of 7,400 kilocycles) will be heterodyned to 455 kilocycles and will comprise the received signal reaching the speaker 20.

It will thus be apparent that any antenna signal lying between 7,000 and 7,400 kilocycles can be tuned in by operation of the tuning control of the second oscillator 16, without any manipulation of the tuning controls associated with the earlier portions of the receiver. This enables the tuned circuits associated with the first oscillator 13 and with any of the radio frequency portions of the receiver to be designed in a simple and efficient manner without the losses normally occasioned by the presence of additional band spread reactances. The tuning control of the second oscillator 16 covers only a relatively small frequency range (400 kilocycles in the example assumed), so that the frequency calibration of this control can be considerably spread, providing ease of reading and accurate calibration.

While a range of 400 kilocycles has been given as a representative example, it will be understood that any range which is a small fraction of the mean frequency of the second oscillator, and a very small fraction of the received signal frequency, may be used. Where signals at quite high frequencies are being received, as for example in excess of 25 or 30 megacycles, it may be desirable to have the first intermediate frequency amplifier 14 and the radio frequency tuned circuits pass a band of one megacycle in width, and to have the second oscillator 16 tunable over a range of one megacycle with a mean frequency of the order of 8 or 9 megacycles, for example. In any event it will be seen that after the desired band and range has been initially selected by operation of the primary tuning controls, ultimate tuning may be effected easily and with accuracy by operation of the tuning control of the second oscillator 16. Moreover, the calibration of this tuning control and the frequency increment covered by its operation remains constant and familiar to the operator regardless of the band on which the set is operating, whether this be of the order of only one or two megacycles or of the order of 30 megacycles or more.

Accuracy of frequency calibration, or relationship between the setting of the tuning control of the second oscillator 16 and the signal frequency received is, of course, a function of the setting of the tuning controls of the earlier portions of the receiver, and particularly of the frequency of the first oscillator 13. In order to enable this first oscillator frequency to be set at a value providing desired correlation between the calibrations of the tuning control of the second oscillator 16 and the frequency of the signal actually being passed through to the speaker, setting of the tuning controls of the initial portions of the receiver may be effected in conjunction with calibrating signals provided by the harmonics of the marker oscillator, as the calibration of the controls associated with the first oscillator 13 would be fully adequate to determine which harmonic of the marker oscillator was being passed through the receiver at a given setting. For example, with the second oscillator control set at zero position, movement of the control of the first oscillator 13 to approximately the 7,000 kilocycle calibration would result in the 35th harmonic of a 200 kilocycle fundamental frequency of the marker oscillator appearing in the output when the first oscillator was set to 5,400 kilocycles. The calibration of the tuning dial associated with the first oscillator might read 7,010 or 7,020 kilocycles, or something under 7,000 kilocycles; but when a marker signal was heard at any position approximating the 7,000 kilocycle graduation, this would be the correct setting of the first oscillator control for the 7,000 to 7,400 kilocycle range. This could be checked still further by tuning the band spread control, the tuning control of the second oscillator 16, through its range, as the next two harmonics of the marker oscillator would then appear at the 200 kilocycle and 400 kilocycle markings on the band spread dial. These provide reference points enabling the receiver to be preadjusted with an accuracy determined by the calibration of the second oscillator dial and the marker frequency; and both of these may be made quite accurate and quite stable.

Another embodiment of my invention is illustrated in Figure 2, the system in this case being shown as provided with visual tuning means of the electronic type, known commonly in the radio art as panoramic types of indicating arrangements. Inasmuch as this system has been fully illustrated and described in certain issued patents of one Dr. Marcel Wallace, as Patents No. 2,279,151, issued April 7, 1942, and 2,312,203, issued February 23, 1943, it will only be very briefly described here and reference may be made to such patents to supplement this disclosure if desired. My band spread arrangement is particularly adaptable for a system using panoramic indication.

In the particular embodiment of this invention illustrated in Figure 2 the majority of the components of the receiver would be similar in construction and operation to those heretofore described in connection with Figure 1, and accordingly this description will be kept brief in connection with these portions of the system. To facilitate review of earlier portions of this specification if desired, portions of the system shown in Figure 2 corresponding to portions shown in Figure 1 will be given reference numerals 20 higher than those used in Figure 1.

In this receiver shown in Figure 2 signals received on the antenna 30 would receive preliminary amplification and selection in a radio frequency amplifier 31 having relatively wide band pass characteristics, and heterodyned in the first mixer 32 with the output of the first high frequency oscillator 33 to convert them to a first intermediate frequency adapted to undergo further amplification and selection in the first intermediate frequency amplifier 34 also having relatively wide band pass characteristics. The output of this amplifier 34 would be heterodyned in the second mixer 35 with the output of the second high frequency oscillator 36, the resulting desired signals being selected and amplified by the second intermediate frequency amplifier 37 having relatively narrow band pass characteristics. As before, the desired signal appearing in the output of this amplifier 37 would be rectified in the detector 38, amplified in the audio frequency amplifier 39, and delivered to the speaker 40. A marker oscillator 41 would be again adapted to provide calibrating signals at accurately predetermined points, and to be operatively connected to the radio frequency amplifier 31 when desired by a switch 42. The part of the receiving system shown in Figure 2 which has just been described would operate in the manner described in connection with the system of Figure 1, the controls associated with the first oscillator 33 and the radio frequency tuned circuits providing preliminary selection of the desired range of frequency to be covered, and variation of the frequency of the second oscillator 36 providing the final tuning.

While tuning of the second oscillator 16 in the system shown in Figure 1 was assumed to be accomplished manually, as by rotation of a variable condenser, tuning of the second oscillator 36 of the system shown in Figure 2 is here indicated as effected by reactance variation in a reactance modulator 43. A switch 44 is adapted selectively to connect the input or control voltage terminal of the reactance modulator 43 to a potentiometer 45 (supplied with voltage from any suitable source, as a power pack or battery), or to a saw-tooth oscillaltor 46. The saw-tooth oscillator, which may be operated at a frequency of the order of 100 cycles, for example, is adapted to apply a saw-tooth voltage to the reactance modulator tube in the unit 43 to provide a periodic linear reactance variation similarly varying the frequency of the second oscillator 36; and at the same time to apply horizontal sweep voltages to the horizontal deflector plates of an oscilloscope tube 47, this voltage being here indicated as developed between the deflector plates 47a and 47b to provide a horizontal sweep of the spot or beam on the screen of the oscilloscope tube. A portion of the voltage output of the detector 38 is diverted and used to develop a vertical deflection voltage, for example, between the deflector plates here identified as 47c and 47d.

Referring now more particularly to Figure 4, and assuming the switch 44 of the system shown in Figure 2 to be in its dotted-line position rendering the saw-tooth oscillator 46 effective, it will be apparent that the pass band which would have been covered by operation of a band spread dial in connection with the second oscillator 36 will be rapidly scanned and signals appearing in that band will appear as vertical deflections of the spot on the oscilloscope screen at points corresponding horizontally to the frequency at which such signals appear; i. e., at the points where the voltage output of the saw-tooth oscillator has caused the reactance modulator 43 to tune the system to that particular frequency. The harmonics of the marker oscillator would appear at the zero, 200 and 400 kilocycle points, in the assumed set of figures previously described, and would appear as peaks or vertical deflections on the oscilloscope screen as illustrated by the peaks identified as *a*, *c* and *e* in Figure 4. Radio signals would also appear on the screen as peaks at other points, as the peaks identified in Figure 4 as *b* and *d*; and the positions of these peaks on the horizontal axis would indicate the frequency of these particular signals. For example, under the conditions assumed in the description of the system in Figure 1 the peak *b* would indicate a signal of 7,100 kilocycles and the peak *d* a signal having a frequency of 7,260 kilocycles. This would provide an immediate visual indication of the signals in the particular range covered by the variation of the second oscillator, and the marker oscillator signals could be left on the screen of the oscilloscope tube, as shown, or eliminated by opening of the marker oscillator switch 42.

In this form of the system the band spread tuning would be effected manually by movement of the arm or movable contact of the potentiometer 45, with the switch 44 in the position shown in solid lines. After the particular band of frequency range in which the user of the set was interested was scanned as just described and illustrated in Figure 4, movement of the switch 44 to the position shown in Figure 2 in solid lines, with the movable arm of the potentiometer 45 being at the "zero" end of its scale (speaking with respect to the graduations, and not necessarily the voltage), the beam spot on the oscilloscope screen might appear at the point identified *f* in Figure 5, for example. Movement of the contact of the potentiometer 45, by varying the reactance of the reactance modulator 43 and thus the frequency of the second oscillator 36, would move the spot along the frequency axis, and cause it to move up vertically to the position of the spot identified as *b* in Figure 5 when the signal at 7,100 kilocycles was tuned to the maximum. This would enable the user of the set readily to see that the signal being tuned in was the same previously seen at the 7,100 point; and by manipulation of the potentiometer control (acting as the manual band spread tuning control in this form of receiver) until the spot *b* was at maximum vertical spacing from the horizontal axis, proper tuning to the center of this signal would be indicated. Similarly, manipulation of the movable contact of the potentiometer 45 would tune the receiver across the entire 450 kilocycle band spread range in a manner analogous to that achieved by rotation of a variable condenser in the tank circuit of the second oscillator 16 of the system of Figure 1.

A still further embodiment of my invention is illustrated in Figure 3, most of the portions of the receiving system illustrated there being analogous in function to those described in connection with Figure 2, so that the description thereof will be kept brief and reference numerals 20 higher than those used in Figure 2 will be applied to corresponding parts. Signals received in the antenna 50, for example, are again passed through a radio frequency amplifier 51 having relatively wide band pass characteristics, and heterodyned in a first mixer 52 with signals in the first high frequency or main tuning oscillator 53. The desired output of the first mixer is again passed through a first intermediate frequency amplifier 54 having relatively wide band pass characteristics to a second mixer 55 where heterodyning is effected with the output of a second high frequency oscillator 56. This oscillator is again tuned by a reactance modulator arrangement 63 adapted to be controlled by a saw-tooth oscillator 66 or by a voltage derived from the potentiometer 65, depending upon the position of the switch 64. The desired signal output of the second mixer 55 is again passed through a second intermediate frequency amplifier 57 having relatively narrow band pass characteristics, rectified in a detector 58, amplified in an audio frequency amplifier 59, and delivered to a speaker 60. The saw-tooth oscillator voltages and signal amplitude voltages are again applied between the horizontal and vertical deflection plates of an oscilloscope 67 to provide visual scanning or panoramic indication of the signals in the particular range being covered. A marker oscillator 61 is again adapted to be connected to the radio frequency amplifier 51, when desired, by a switch 62.

The system shown in Figure 3 differs from that shown in Figure 2 primarily in the addition of discriminating and frequency control means for the first high frequency oscillator 53. Part of the output of the amplifier 54 is diverted through an intermediate frequency amplifier 70 having narrow band pass characteristics and sharply and fixedly tuned to a frequency at one end of the pass range of the amplifier 54, as for example to 1,600 kilocycles. The output of this amplifier 70 is delivered to a discriminator 71 which feeds back voltage generated therein to an automatic frequency control arrangement 72 adapted to stabilize the frequency of the first oscillator 53.

The system shown in Figure 3 is used in a manner similar to that described in connection with Figure 2, in that the user may first scan the frequency range by use of the saw-tooth oscillator 66 and then select a desired signal by means of the potentiometer 65, for example. Initially, in connection with the setting of the first high frequency oscillator 53, the screen of the oscilloscope would be used to indicate when the first oscillator 53 was tuned to the proper point to cause the desired marker signal *a* to appear at the zero graduation on the screen of the oscilloscope. This marker signal will pass through the 1,600 kilocycles tuned circuits of the intermediate frequency amplifier 70 and actuate the discriminator 71 and automatic frequency control 72 to hold the receiver locked in to that frequency so that the 7,000 kilocycle point would not drift away from the zero graduation on the scale of the oscilloscope tube. That is, the parts 70, 71 and 72 would operate to prevent and compensate for any tendency of the first oscillator 53 to drift. As has been brought out before, the second oscillator 56 can be made exceedingly stable, and the result of automatic control of the frequency of the first oscillator 53 is to provide a frequency stability of the receiver substantially equivalent to crystal control, while at the same time retaining the full flexibility of tuning so desirable in a communications receiver.

While I have shown and described certain embodiments of my invention, it is to be understood that it is capable of many modifications. Changes, therefore, in the construction and arrangement may be made without departing from the spirit and scope of the invention as disclosed in the appended claims.

I claim:

1. Radio receiving apparatus of the character described, including: apparatus including a marker oscillator providing a plurality of calibrating signals at equally spaced frequencies over a range of the receiving apparatus comprising harmonics of a fundamental frequency; a radio frequency amplifier designed to pass substantially uniformly a frequency band of at least 100 kilocycles; a first mixer coupled to the output of said amplifier; a first variable tuning oscillator coupled to said mixer and comprising the main tuning control for said apparatus, the construction and arrangement being such that signals on any selected one of a plurality of bands are heterodyned to a first intermediate frequency; a first intermediate frequency amplifier coupled to the output of said first mixer, this amplifier having relatively wide band pass characteristics, being designed to pass substantially without attenuation a band of the same order of width as that which the radio frequency amplifier is designed to pass, said band having a width of at least 100 kilocycles; a second mixer coupled to the output of said first intermediate frequency amplifier; a second variable oscillator coupled to said second mixer, said second oscillator being independently manually variable over a relatively limited predetermined frequency range comprising only a small fraction of the mean frequency of said second oscillator but at least double said fundamental frequency, and having a relatively accurately calibrated indicator associated therewith, whereby said second oscillator provides band spread tuning means providing identical frequency spread on any of said plurality of bands; a second intermediate frequency amplifier coupled to the output of said second mixer; detecting and amplifying apparatus for detecting and amplifying the output of said second intermediate frequency amplifier; and transducing means including means coupled to said detecting apparatus for providing a visual indication and means coupled to the last mentioned amplifying apparatus for providing and audible indication.

2. Radio receiving apparatus of the character described, including: apparatus providing a plurality of calibrating signals at equally spaced frequencies over a range of the receiving apparatus comprising harmonics of a fundamental frequency and including apparatus for suppressing either the odd or even harmonics thereof; a radio frequency amplifier designed to pass substantially uniformly a frequency band of sufficient width to include a plurality of signal channels spaced in frequency from each other; a first mixer coupled to the output of said radio frequency amplifier; a first variable tuning oscillator coupled to said mixer, the construction and arrangement being such that signals on any selected one of a plurality of bands are heterodyned to a first intermediate frequency; a first intermediate frequency amplifier coupled to the output of said mixer, this amplifier having relatively wide band pass characteristics, being designed to pass substantially without attenuation a band of the same order of width as that which the radio frequency amplifier is designed to pass; a second mixer coupled to the output of said intermediate frequency amplifier; a second variable oscillator coupled to said second mixer, this second oscillator being independently manually variable over a relatively limited predetermined frequency range comprising only a small fraction of the mean frequency of this second oscillator but at least double said fundamental frequency, and having a relatively accurately calibrated indicator associated therewith, whereby said second oscillator provides band spread tuning means providing identical frequency spread on any of said plurality of bands; a second intermediate frequency amplifier coupled to the output of said second mixer; detecting and amplifying apparatus for detecting and amplifying the output of said second intermediate frequency amplifier; and transducing means including means coupled to said detecting apparatus for providing a visual indication and means coupled to the last mentioned amplifying apparatus for providing an audible indication.

ROBERT E. SAMUELSON.

References Cited in the file of this patent

UNITED STATES PATENTS

| Number | Name | Date |
|---|---|---|
| 1,753,444 | Ohl | Apr. 8, 1930 |
| 2,084,760 | Beverage | June 22, 1937 |
| 2,178,074 | Jakel | Oct. 31, 1939 |
| 2,184,072 | Freeman | Dec. 19, 1939 |
| 2,245,385 | Carlson | June 10, 1941 |
| 2,263,634 | Landon | Nov. 25, 1941 |
| 2,381,940 | Wallace | Aug. 14, 1945 |
| 2,416,346 | Potter | Feb. 25, 1947 |
| 2,505,754 | Combs | May 2, 1950 |

OTHER REFERENCES

"Panoramic Principles," by W. E. Moulic, Fig. 3, pages 86, 87, 88, 106, July 1944, of Electronic Industries.